(12) United States Patent
Hierl et al.

(10) Patent No.: US 9,488,704 B2
(45) Date of Patent: Nov. 8, 2016

(54) MAGNETIC RESONANCE APPARATUS WITH SOUND ABSORPTION CLADDING AND IRREGULAR GRID

(75) Inventors: Andreas Hierl, Veitsbronn (DE); Bernd Maciejewski, Markt Erlbach (DE); Annette Stein, Erlangen (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 893 days.

(21) Appl. No.: 13/603,580

(22) Filed: Sep. 5, 2012

(65) Prior Publication Data

US 2013/0234709 A1 Sep. 12, 2013

(30) Foreign Application Priority Data

Sep. 9, 2011 (DE) ........................ 10 2011 082 402

(51) Int. Cl.
*G01R 33/28* (2006.01)

(52) U.S. Cl.
CPC ..................................... *G01R 33/28* (2013.01)

(58) Field of Classification Search
USPC .............................. 324/300–322; 600/407–435
See application file for complete search history.

(56) References Cited

U.S. PATENT DOCUMENTS

| | | | | |
|---|---|---|---|---|
| 5,345,177 | A * | 9/1994 | Sato et al. | 324/318 |
| 6,414,489 | B1 * | 7/2002 | Dean et al. | 324/318 |
| 6,437,568 | B1 * | 8/2002 | Edelstein et al. | 324/318 |
| 6,597,174 | B2 * | 7/2003 | Arz | 324/318 |
| 2003/0016018 | A1 * | 1/2003 | Arz | 324/318 |
| 2003/0088172 | A1 * | 5/2003 | Kuth | 600/407 |
| 2005/0040825 | A1 * | 2/2005 | Sellers et al. | 324/318 |
| 2005/0103564 | A1 | 5/2005 | Duval et al. | |
| 2009/0044212 | A1 | 2/2009 | Dietz et al. | |
| 2009/0260917 | A1 | 10/2009 | Maciejewski | |
| 2010/0006372 | A1 | 1/2010 | Bischoff et al. | |
| 2012/0212375 | A1 * | 8/2012 | Depree, IV | H01Q 15/0086 343/700 MS |
| 2013/0200896 | A1 * | 8/2013 | Maciejewski | 324/318 |
| 2013/0234709 | A1 * | 9/2013 | Hierl et al. | 324/318 |
| 2013/0234711 | A1 * | 9/2013 | Dietz et al. | 324/319 |
| 2013/0234712 | A1 * | 9/2013 | Dietz et al. | 324/319 |
| 2013/0234713 | A1 * | 9/2013 | Maciejewski et al. | 324/321 |
| 2013/0237805 | A1 * | 9/2013 | Dietz | A61B 5/055 600/410 |

FOREIGN PATENT DOCUMENTS

| | | |
|---|---|---|
| DE | 202006008449 U1 | 8/2006 |
| DE | 102007037851 A1 | 2/2009 |
| GB | 2163388 A | 2/1986 |
| JP | H0332643 A | 2/1991 |

OTHER PUBLICATIONS

T. Trendelenburg et al., electronically available NPL slide presentation "Processing and Properties of Alulight Aluminum Foams and Sandwich Panels for Shipboard Applications" from Feb. 14, 2008 slides 1-37.*
SoundCoat Technical Data sheet covering the trademarked Soundfoam-ML HY (2pages) from May 2009 (3) Published by Soundcoat corporation.*
Barrier Composites Materials Summary Sheet, EAR, Aearo Technologies; Others.

* cited by examiner

*Primary Examiner* — Melissa Koval
*Assistant Examiner* — Tiffany Fetzner

(57) ABSTRACT

A magnetic resonance apparatus is proposed. The magnetic resonance apparatus has a magnet unit, magnet housing and a housing unit surrounding the magnet unit. The housing unit includes at least one support structure unit and a cladding unit. The cladding unit has at least one first layer, which includes a sound absorption element, and at least one second layer, which includes a heavy mass layer.

11 Claims, 2 Drawing Sheets

Legend:
11: magnet unit
14: imaging region
30: housing unit
31: support structure unit
32: cladding unit
33: first layer of 32
34: sound absorption element
35: second layer of 32
36: two-layer heavy mat film
37: thickness of 33
38: thickness of 35
39: support structure element
40: distance between 39
41: latching element
42: latching area
43: control area
44: front side of magnetic resonance apparatus
45: lacquer coat

MAGNETIC RESONANCE APPARATUS WITH SOUND ABSORPTION CLADDING AND IRREGULAR GRID

CROSS REFERENCE TO RELATED APPLICATION

This application claims priority of German application No. 10 2011 082 402.2 filed Sep. 9, 2011, which is incorporated by reference herein in its entirety.

FIELD OF INVENTION

The present application relates to a magnetic resonance apparatus with a magnet unit and a housing unit surrounding the magnet unit, said housing unit having at least one support structure unit and a cladding unit.

BACKGROUND OF INVENTION

During operation, magnetic resonance apparatuses generate high levels of noise, which can have an unpleasant effect on a patient occupying an imaging area of the magnetic resonance apparatus for an examination. These high levels of operating noise are generated within a magnet unit of the magnetic resonance apparatus on account of interaction between a gradient unit and a magnet. Sound waves are transmitted in such cases within the magnetic resonance apparatus by an air-borne sound excitation and also by way of solid-borne sound entry. The high levels of operating noise are in this way transmitted to a housing unit of the magnetic resonance apparatus and emitted from this housing unit into a space surrounding the magnetic resonance apparatus.

Conventional housing units of magnetic resonance apparatuses have a single-shell housing shell unit, which is formed for instance of a glass fiber-reinforced plastic and/or a thermoplast. On account of their weight, these housing shell units comprise a certain sound dampening, but housing shell units embodied as such nevertheless also have a high emission characteristic in respect of the emission of sound waves, which is caused on account of a material rigidity of the housing shell units.

SUMMARY OF INVENTION

The object underlying the present application is to provide a magnetic resonance apparatus, in which an effective noise dampening and/or noise decoupling is achieved in the housing unit. The object is achieved by the features of the independent claim. Embodiments are described in the dependent claims.

The application is based on a magnetic resonance apparatus with a magnet unit and a housing unit surrounding the magnet unit, said housing unit having at least one support structure unit and a cladding unit.

It is proposed that the cladding unit comprises at least one first layer, which includes a sound absorption element, and at least one second layer, which includes a heavy mass layer. A heavy mass layer is to be understood in this context to mean a mass layer which has a density, such as a surface density, of at least 3 k g/m² or a surface density of approximately 5 kg/m². The heavy mass layer can be formed for instance of a PVC material and/or an EPDM (ethylene propylene diene monomer) material and/or a silicon material and/or further materials with a high surface density which appear meaningful to the person skilled in the art. The sound absorption element is formed of a soft foam, wherein a sound absorption element is herewith to be understood to mean an absorption element, which is designed to convert sound energy from sound waves into oscillation energy of inaudible oscillation waves, and accordingly to reduce or prevent a reflection of audible sound waves on a boundary surface. The sound waves, such as the air-borne sound waves, cause individual particles, such as for instance foam particles, of the sound absorption element, to oscillate, wherein a generated oscillation energy within the sound absorption element is converted into thermal energy. Oscillation energy is then taken from the sound waves, such as the air-borne sound waves and dampens the air-borne sound waves. A dampening and/or decoupling of the sound waves within the housing unit can take place by this embodiment and in such a way an emission of sound waves from the housing unit can be minimized during operation of the magnetic resonance apparatus. An embodiment of the housing unit of this type brings about a noise reduction during operation of the magnetic resonance apparatus of up to 10 dB compared with conventional rigid housing shells of magnetic resonance apparatuses.

The housing unit, such as the cladding unit, acts here as a flexible spring-mass unit, which has at least one elastic spring element, such as for instance the soft foam unit, and a heavy mass element, here the heavy mass layer, so that on account of a high mass inertia and an absorption of oscillation energy of sound waves, dampening and/or decoupling of sound waves can be achieved. The at least one elastic spring element and the heavy mass element can herewith be embodied in one piece. Furthermore, a flexible embodiment of the spring-mass unit is to be understood as a resonance frequency of the spring-mass unit being arranged above 3000 Hz or above 5000 Hz so that the resonance frequency of the flexible spring mass unit lies outside of a frequency range which is relevant to a noise transmission within the magnetic resonance frequency.

Furthermore, it is proposed that the cladding unit be formed at least partially from a two-layer heavy mat film, as a result of which the cladding unit can be embodied in a compact manner, such as in respect of assembly of the cladding unit on the support structure unit and simplified assembly can be achieved in this way. In this context, a heavy mat film is to be understood to be film which has a surface density of at least 3 kg/m² or of approx. 5 kg/m². A first layer of the two-layer heavy mat film is formed by a sound absorption layer, such as for instance a soft foam layer, and a second layer of the two-layer heavy mat film by the heavy mass layer.

In a development of the application, it is proposed that the first layer has a layer thickness of at least 5 mm and a maximum of 10 mm, however a layer thickness of approximately 6.5 mm is preferred. The cladding unit can herewith be structured thinly and in addition a material thickness for absorption of sound waves within the cladding unit, such as within the sound absorption layer, can be achieved and in this way a high sound wave dampening within the cladding unit can be achieved.

If the layer thickness of the second layer is at least 0.5 mm and has a maximum of 2.5 mm, the cladding unit can be provided with a sufficiently heavy mass layer, which amounts to a sound wave dampening within the cladding unit, on account of a large mass inertia, and in addition the cladding unit is embodied in a compact manner on account of the thin mass layer. The second layer however, preferably has a layer thickness of approximately 1 mm to 2 mm.

It is furthermore proposed that the housing unit has a lacquer coat, which is arranged on a side of the heavy mass layer which faces away from the magnet unit. A surface of the magnetic resonance apparatus which is visible to a patient and/or operator can herewith be integrated in a compact and component-saving manner within the cladding unit.

In a further embodiment of the application, it is proposed that the support structure unit has a grid-type support structure, which is arranged on the magnet unit, as a result of which provision can be made for a smaller transmission surface for a sound wave transmission compared with a support structure unit embodied over the entire surface. The housing unit can also be embodied to be lightweight and additionally arranged in a compact manner around the magnet unit. The grid-type support structure unit is formed of a polyester resin, which is reinforced with glass fibers, which can be produced for instance by hot pressing. Moreover, the grid-type support structure unit can also be produced as a molded part, for instance by deep-drawing and a subsequent milling of holes and/or openings.

It is furthermore proposed that the grid-type support structure unit is irregular and comprises irregularly arranged support structure elements, as a result of which a resonance excitation within the support structure unit can be prevented during a sound wave transmission. Furthermore, on account of the irregularly arranged support structure elements, shrink marks and/or kinks can be prevented on the cladding unit. Furthermore, an optically homogenous surface of the cladding unit can be achieved, with which roll marks can be prevented on account of a regular pattern of the support structure unit. In this context, irregularly arranged support structure elements are to be understood to mean support structure elements, which are arranged at an irregular distance from one another. In addition, the irregularly arranged support structure elements can also be differentiated in respect of the shape of the individual support structure elements.

In a further embodiment of the application, it is proposed that the irregular grid-type support structure unit has a fine-meshed support structure with several irregularly arranged recesses, which are surrounded in each instance by support structure elements, wherein the support structure elements each have a length of at least 5 cm and a maximum of 20 cm along a recess. The support structure elements framing the recesses comprise however a length of approximately 10 cm to 15 cm along the recess, so that the recesses have a maximum cross-section between two opposite support structure elements framing the recesses of 20 cm and of a maximum of 15 cm. Contact protection can be achieved between the cladding unit and mechanically moveable components and/or electrical components of the magnet unit. Extrusion of the cladding unit up to an outer wall of the magnet unit can herewith be prevented on account of the fine-meshed support structure unit. The fine-meshed support structure unit is designed such that together with the cladding unit, it withstands a compressive force of at least 25 kg with a test pin, which has a diameter of 30 mm. The fine-meshed support structure is arranged on at least one front side and/or rear side of the magnet unit, so that protection of live components can be achieved.

A constructively simple and time-saving fastening of the cladding unit to the support structure unit can be achieved if the housing unit comprises at least one latching element, by which the cladding unit is fastened to the support structure unit. Alternatively, further fastening elements appearing meaningful to the person skilled in the art can be used at any time to fasten the cladding unit to the support structure unit, such as for instance a Velcro fastener between the cladding unit and the support structure unit and/or a fastening by an expanding rivet.

BRIEF DESCRIPTION OF THE DRAWINGS

Features and details of the application result from the embodiment described below as well as with the aid of the drawings, in which.

DETAILED DESCRIPTION OF INVENTION

Figure 1:
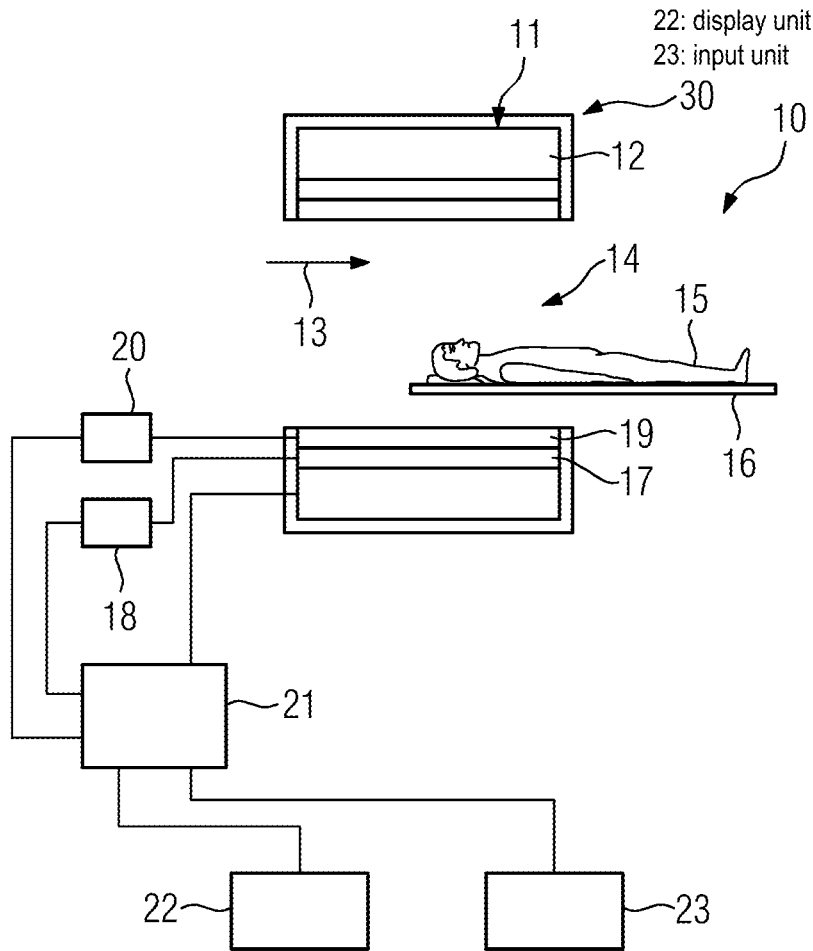
FIG. 1 shows a disclosed magnetic resonance apparatus in a schematic representation.

A disclosed magnetic resonance apparatus 10 is shown schematically in FIG. 1. The magnetic resonance apparatus 10 includes a magnet unit 11 with a main magnet 12 for generating a strong and constant main magnetic field 13. Furthermore, the magnetic resonance apparatus 10 also comprises a cylindrical receiving area 14 for receiving a patient 15, wherein the receiving area 14 is enclosed in a circumferential direction by the magnet unit 11. The patient 15 can be moved into the receiving area 14 by a patient couch 16 of the magnetic resonance apparatus 10. The patient couch 16 is to this end arranged so as to be moveable within the magnetic resonance apparatus 10. Furthermore, the magnetic resonance apparatus 10 comprises a housing unit 30 surrounding the magnet unit 11.

The magnet unit 11 furthermore comprises a gradient coil 17 for generating magnetic field gradients, which are used for a local encoding during an imaging process. The gradient coil 17 is controlled by a gradient control unit 18. Furthermore, the magnet unit 11 comprises a high frequency antenna 19 and a high frequency antenna unit 20 in order to excite a polarization which develops in a main magnetic field generated by the main magnet 12. The high frequency antenna 19 is controlled by the high frequency antenna unit 20 and emits high frequency magnetic resonance sequences into an examination space, which is formed by the receiving area 14. The magnetization is herewith deflected from its position of equilibrium. Moreover, magnetic resonance signals are received by the high frequency antenna unit 20.

The magnetic resonance apparatus 10 comprises a control unit 21 formed by a processing unit in order to control the main magnet 12, the gradient control unit 18 and the high frequency antenna unit 20. The processing unit controls the magnetic resonance apparatus 10 centrally, by implementing a predetermined imaging gradient echo sequence. Control information such as for instance imaging parameters and reconstructed magnetic resonance images can be displayed to an operator on a display unit 22, or on at least one monitor, of the magnetic resonance apparatus 10. Furthermore, the magnetic resonance apparatus 10 comprises an input unit 23, by which information and/or parameters during a measuring process can be entered by an operator.

The magnetic resonance apparatus 10 shown can naturally include further components that magnetic resonance apparatuses 10 usually feature. The way in which a magnetic resonance apparatus 10 generally functions is also known to the person skilled in the art, so that there is no need for a detailed description of the general components.

Figure 2:
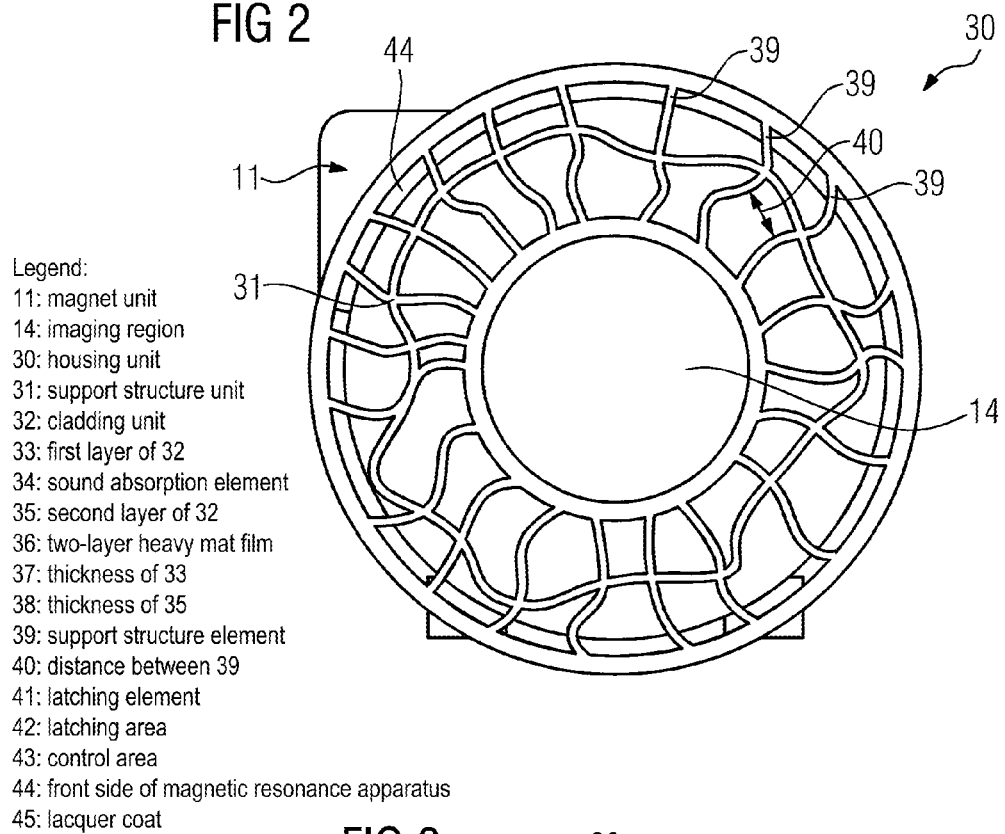
FIG. 2 shows a housing unit with a support structure unit.
Figure 3:
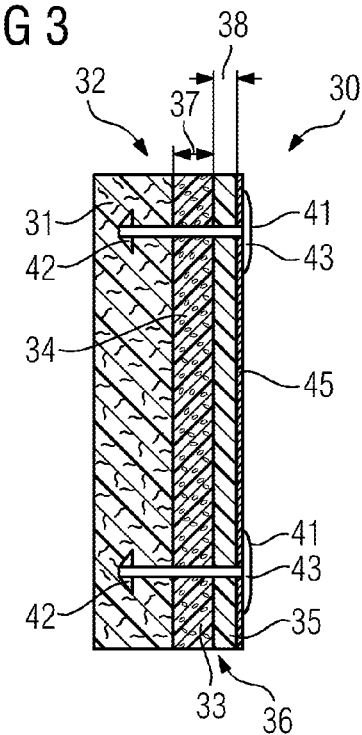
FIG. 3 shows a cutout of the housing unit with the support structure unit and a cladding unit.

The housing unit 30 is shown in more detail in FIGS. 2 and 3. The housing unit 30 is embodied to be compatible in terms of magnetic resonance for an arrangement around the magnet unit 11 of the magnetic resonance apparatus 10.

The housing unit 30 comprises a support structure unit 31 and a cladding unit 32. The cladding unit 32 is embodied in at least two layers to reduce a noise emission (FIG. 3). A first layer 33 of the cladding unit 32 includes a sound absorption element 34, which is formed of a soft foam. A second layer 35 of the cladding unit 32 includes a heavy mass layer 35, which is formed of a PVC material and/or an EPDM (ethylene propylene diene monomer) material and/or a silicon material etc. A surface density of the heavy mass layer amounts here to at least 3 kg/m$^2$, however to approximately 5 kg/m$^2$. Approximately 5 kg/m$^2$ is herewith understood to mean that the surface density has a value of 5 kg/m$^2$ with a tolerance of a maximum of 20% or a maximum of 10%.

The sound absorption element 34 and the heavy mass layer 35 form a flexible spring-mass unit of the cladding unit 32. The two layers 33, 35 are also embodied in one piece as a two layer heavy mat film 36. A layer thickness 37 of the first layer 33 amounts here to approximately 6.5 mm and a layer thickness 38 of the second layer to approximately 1 mm to 2 mm.

The support structure unit 31 comprises an irregular grid-type support structure, as visible in FIG. 2. The irregular grid-type support structure unit 31 is arranged on the magnet unit so as to envelope the magnet unit 11. Furthermore, the irregular grid-type support structure unit 31 is formed by a polyester resin, which can be reinforced with glass fibers, which is produced in one instance by hot pressing. Alternatively, the irregular grid-type support structure unit 31 can to this end also be produced as a molded part, by deep-drawing and a subsequent milling of holes and/or openings.

The irregular grid-type support structure 31 comprises several support structure elements 39, which are arranged irregularly with respect to one another. The support structure elements 39 here are at an irregular distance 40 from one another, wherein the distance 40 between two support structure elements 39 can vary along this support element 39. In addition, the individual support structure elements 39, such as support structure elements arranged adjacent to one another, differ in respect of their shape, such as for instance in respect of a thickness of the individual support structure elements 39 and/or bends along a longitudinal direction of the individual support structure element 39.

The irregular grid-type support structure unit 31 also comprises a fine-meshed support structure, so that a contact protection is achieved between the cladding unit 32 and mechanically moveable components and/or electrical components of the magnet unit 11. The fine-meshed support structure unit 31 is designed such that, together with the cladding unit 32, it withstands a compressive force of at least 25 kg with a test pin which has a diameter of 30 mm. The fine-meshed support structure comprises several irregularly arranged recesses, each of which is framed by support structure elements 39, wherein the support structure elements 39 each have a length of at least 5 cm and a maximum of 20 cm along a recess. The support structure elements 39 surrounding the recesses comprise however a length of approximately 10 cm to 15 cm, so that the recesses have a maximum cross-section between two opposite support structure elements 39 and 20 framing the recess and of a maximum of 15 cm.

The housing unit 30 further comprises latching elements 41 for fastening the cladding unit 32 on the support structure unit 31, as apparent from FIG. 3. The latching elements 41 comprise a plate-type latching area 42 and a head-type control area 43, which are arranged at opposite ends of a cylindrical pin of the latching element 41. By the plate-type latching area 42, a form-fit latching connection is achieved between the latching element 41 and the support structure unit 31, while the head-type control area 43 holds the cladding unit 32 in position. In addition, the latching elements 41 are introduced into the cladding unit 32 and the support structure unit 31 by an operator by exerting pressure on the head-side control area 43. Alternatively, the latching elements 41 can also be introduced by a screwing movement, when in latching elements 41 with a screw inlay which are embodied as expanding rivets for instance. The latching elements 41 are embodied to be compatible in terms of magnetic resonance.

The support structure unit 31 with the fine-meshed and irregular grid-type support structure is arranged on a front side 44 and a rear side of the magnetic resonance apparatus 10, wherein the electronic components of the magnet unit are arranged on the front side and/or the rear side. In addition, the support structure unit 31 with the fine-meshed and irregular support structure can also be arranged on lateral areas of the magnetic resonance apparatus 10. The support structure unit 31 can also comprise a simplified embodied support structure on these side areas.

The cladding unit 32 is arranged on a side of the support structure unit 31 facing away from the magnet unit 11 and is fastened hereto by the latching elements 41. To this end, the first layer 33 of the two-layer heavy mat film 36 formed of soft foam is arranged so as to be positioned and located on the support structure unit 31 and the heavy mass layer 35 of the two-layer heavy mat film 36 is arranged on the side of the sound absorption element 34 facing away from the support structure unit 31 and the magnet unit 11. The side of the two-layer heavy mat film 36 facing away from the magnet unit 11 forms an outer casing of the magnet unit 11. To this end, the housing unit 30 has a lacquer coat 45, which is arranged on the side of the two-layer heavy mat film 36 facing away from the magnet unit 11. The lacquer coat 45 is herewith arranged on a side of the heavy mass layer 35 facing away from the magnet unit 11.

Alternatively, the embodiment of the housing unit 30 described here, this can also comprise a support structure unit 31, which is embodied to be adjustable in terms of length in at least one direction or in two or three directions. Moreover, in an alternative embodiment of the application provision can also be made for the support structure unit 31 to be arranged separately from the magnet unit 11. To this end, the support structure unit 31 can be arranged on a bearing surface for mounting the magnetic resonance apparatus 10, such as a base surface of an examination space in a clinical building.

Furthermore, the first layer of the two-layer heavy mat film 36 can also be embodied to be thicker than 6.5 mm so that a spring function compared with the support structure unit 31 and an air-borne sound absorption is achieved here.

The invention claimed is:
1. A magnetic resonance apparatus, comprising:
a magnet unit comprising a main magnet, a gradient coil and a high frequency antenna; and
a housing unit surrounding the magnet unit,
wherein housing unit comprises at least one support structure unit and a cladding unit,
wherein the cladding unit comprises at least one first layer and at least one second layer, wherein the at least one first layer comprises a sound absorption element, wherein the at least one second layer comprises a heavy mass layer which has a surface density of at least 3 kg/m² or a surface density of approximately 5 kg/m², wherein the support structure unit comprises an irregular grid-type support structure arranged on the magnet unit, wherein the grid-type support structure unit comprises a plurality of support structure elements that are different in respect of shapes to one another, wherein the cladding unit is arranged on a side of the irregular grid-type support structure unit facing away from the magnet unit, wherein the first layer of the cladding unit comprising the sound absorption element is positioned and located on the support unit facing away from the magnet unit, wherein the second layer of the cladding unit comprising the heavy mass layer is arranged on a side of the sound absorption element facing away from the irregular grid-type support structure unit and the magnet unit, and wherein a side of the second layer of the cladding unit comprising the heavy mass layer facing away from the magnet unit forms an outer casing around the magnet unit comprising the main magnet, gradient coil and high frequency antenna.

2. The magnetic resonance apparatus as claimed in claim 1, wherein the cladding unit is formed at least partially from a two-layer heavy mat film where the two-layer heavy mat film has a surface density of at least 3 kg/m² or of approx. 5 kg/m².

3. The magnetic resonance apparatus as claimed in claim 1, wherein the at least one first layer comprises a layer thickness of at least 5 mm and a maximum of 10 mm.

4. The magnetic resonance apparatus as claimed in claim 1, wherein the at least one second layer comprises a layer thickness of at least 0.5 mm and a maximum of 2.5 mm.

5. The magnetic resonance apparatus as claimed in claim 1, wherein the housing unit comprises a lacquer coat arranged on a side of the heavy mass layer facing away from the magnet unit.

6. The magnetic resonance apparatus as claimed in claim 1, wherein the irregular grid-type support structure elements are arranged at an irregular distance from one another.

7. The magnetic resonance apparatus as claimed in claim 1, wherein the irregular grid-type support structure unit comprises a fine-meshed support structure comprising a plurality of irregularly positioned recesses.

8. The magnetic resonance apparatus as claimed in claim 7, wherein each of the irregularly positioned recesses is framed by the irregular grid-type support structure elements.

9. The magnetic resonance apparatus as claimed in claim 8, wherein the irregular grid-type support structure elements have a length of at least 5 cm and a maximum of 20 cm along the each of the recesses.

10. The magnetic resonance apparatus as claimed in claim 7, wherein the fine-meshed support structure is arranged on at least a front side and/or rear side of the magnet unit.

11. The magnetic resonance apparatus as claimed in claim 1, wherein the housing unit comprises at least one latching element configured for fastening the cladding unit onto the irregular grid-type support structure unit.

* * * * *